(12) United States Patent
Fingerle

(10) Patent No.: US 9,595,807 B2
(45) Date of Patent: Mar. 14, 2017

(54) CIRCUIT ARRANGEMENT FOR OPERATING LASER DIODE

(71) Applicant: Balluff GmbH, Neuhausen a.d.F. (DE)

(72) Inventor: Bernd Fingerle, Schlaitdorf (DE)

(73) Assignee: Balluff GmbH, Neuhausen a.d.F. (DE)

( * ) Notice: Subject to any disclaimer, the term of this patent is extended or adjusted under 35 U.S.C. 154(b) by 0 days.

(21) Appl. No.: 14/432,868

(22) PCT Filed: Oct. 2, 2013

(86) PCT No.: PCT/DE2013/000561
§ 371 (c)(1),
(2) Date: Apr. 1, 2015

(87) PCT Pub. No.: WO2014/053116
PCT Pub. Date: Apr. 10, 2014

(65) Prior Publication Data
US 2015/0280397 A1      Oct. 1, 2015

(30) Foreign Application Priority Data

Oct. 2, 2012 (DE) .................. 10 2012 019 339
Nov. 9, 2012 (DE) .................. 10 2012 022 053

(51) Int. Cl.
*H01S 5/042* (2006.01)
*H01S 5/0683* (2006.01)
*H01S 5/068* (2006.01)

(52) U.S. Cl.
CPC .......... *H01S 5/0428* (2013.01); *H01S 5/0683* (2013.01); *H01S 5/06835* (2013.01); *H01S 5/06825* (2013.01)

(58) Field of Classification Search
CPC .................. H01S 5/0428; H01S 5/0683
See application file for complete search history.

(56) References Cited

U.S. PATENT DOCUMENTS

| 4,872,080 A | 10/1989 | Hentschel et al. |
| 5,802,089 A | 9/1998 | Link |

(Continued)

FOREIGN PATENT DOCUMENTS

| DE | 29 11 858 C2 | 10/1980 |
| DE | 33 31 132 C1 | 2/1985 |
| GB | 2 045 516 A | 10/1980 |

OTHER PUBLICATIONS

International Search Report of PCT/DE2013/000561, mailed Mar. 27, 2014.

(Continued)

*Primary Examiner* — Tod T Van Roy
(74) *Attorney, Agent, or Firm* — Collard & Roe, P.C.

(57) ABSTRACT

A circuit arrangement for operating a laser diode in clocked mode includes a monitor photodiode, from the signal of which a measure of the radiation emitted by the laser diode is obtained as voltage to be measured, and a comparator, which compares the voltage to be measured with a reference voltage and provides the difference signal to a controller, wherein both the voltage to be measured and the reference voltage are applied continuously to the comparator. In order to carry out operation of the laser diode in clocked mode, a clocked-mode operation of the energy supply of the comparator is provided.

12 Claims, 6 Drawing Sheets

(56) References Cited

U.S. PATENT DOCUMENTS

Figure 1:
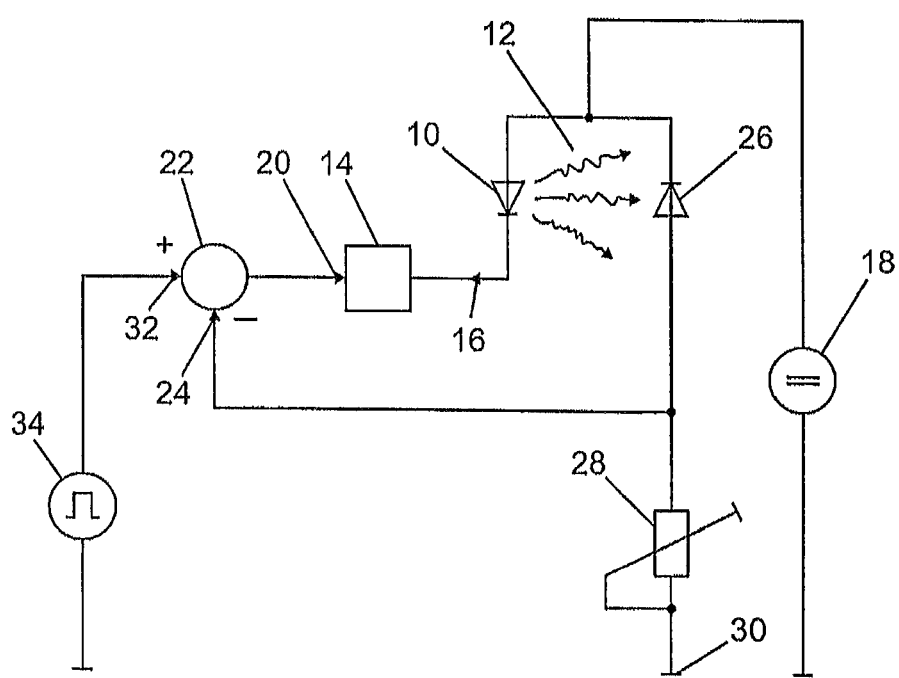

| | | | |
|---|---|---|---|
| 6,097,746 A | 8/2000 | Noda et al. | |
| 6,496,525 B1* | 12/2002 | Kimura | H01S 5/0683 |
| | | | 372/29.01 |
| 2003/0034694 A1 | 2/2003 | Lin et al. | |
| 2003/0138010 A1* | 7/2003 | Herz | H01S 5/0683 |
| | | | 372/38.02 |
| 2003/0174744 A1* | 9/2003 | Reilly | H01S 5/0683 |
| | | | 372/32 |
| 2005/0105438 A1* | 5/2005 | Hibino | G11B 7/0062 |
| | | | 369/59.12 |
| 2005/0105574 A1 | 5/2005 | Wu et al. | |
| 2005/0207460 A1* | 9/2005 | Koda | G11B 7/126 |
| | | | 372/38.02 |
| 2009/0190621 A1* | 7/2009 | Anderson | H01S 5/06825 |
| | | | 372/38.03 |
| 2010/0231287 A1* | 9/2010 | Modica | H03F 3/45085 |
| | | | 327/512 |

OTHER PUBLICATIONS

U. Malzahn, specialist journal Photonik, No. May 2003, Grundlagen der Laserdiodenansteuerung-Laserdioden verstehen und sicher ansteuern, pp. 2 to 4. (2003) (4 pages).

U. Malzahn, specialist journal electronic industry, No. May 2004, Ausgangsleistung von Laserdioden einfach regeln, pp. 44 and 45. (2004) (2 pages).

"Field-effect transister", article from Wikipedia, downloaded on Jul. 25, 2016 from https://en.wikipedia.org/wiki/Field-effect_transistor.

* cited by examiner

CIRCUIT ARRANGEMENT FOR OPERATING LASER DIODE

CROSS REFERENCE TO RELATED APPLICATIONS

This application is the National Stage of PCT/DE2013/000561 filed on Oct. 2, 2013, which claims priority under 35 U.S.C. §119 of German Application Nos. 10 2012 019 339.4 filed on Oct. 2, 2012, and 10 2012 022 053.7 filed on Nov. 9, 2012, the disclosures of which are incorporated by reference. The international application under PCT article 21(2) was not published in English.

STATE OF THE ART

The invention is based on circuit arrangement for operating a laser diode in clocked mode.

When it comes to the actuation of laser diodes, some security measures have to be taken in order to ensure a safe operation. The maximal optical output power indicated by the manufacturer of the laser diode is not to be exceeded. Even if the peak power is exceeded only for a brief time, this may lead to the laser diode being damaged or even completely destroyed. A laser diode is highly sensitive to voltage and current peaks, which may be caused by an electrostatic discharge or by a coupling-in of an interfering signal in the control circuit, for example. Further, laser diodes are subject to large variations of the bias point at a constant optic output power. In addition, a comparatively large temperature drift of the optical output power occurs.

Pre-existing defects—even when they are caused by only one short overload due to a voltage peak, peak current, exceeding of the maximal admissible radiated power or exceeding of the maximal admissible temperature—can alter the radiation characteristic of the laser diode and lead to early failure in the use of the laser diode.

In the specialist journal Photonik, No 5/2003, pages 2-4, fundamentals for the actuation of laser diodes are described, with different safety aspects being addressed.

Laser diodes are offered as modules, wherein a monitor receiver, which may e.g. be realized as a photodiode that is directly irradiated by the laser diode, is arranged inside a housing next to the laser diode. The monitor receiver facilitates a monitoring or control of the laser diode output power.

In the patent document DE 29 11 858 C2, a circuit arrangement for operating a laser diode is described, in which the radiated power emitted by the laser diode is limited. In the patent application, which was filed already in 1979, a separate photodiode is provided as a monitor receiver instead of a laser diode module. The radiated power received by the monitor photodiode is converted into a voltage, which is compared to a reference voltage in a comparator that is embodied as a differential amplifier. The differential amplifier controls a voltage/current converter, which is realized as a simple controllable power source that presets the operating current of the continuously operated laser diode.

In the patent document DE 33 31 132 C1, a circuit arrangement for operating a laser diode is described, which contains a limiter circuit for the laser diode output power. The laser diode's optical radiation is controlled by means of a control circuit that is actuated with a part of the radiation that is emitted by the laser diode, which is decoupled by a beam splitter from the output radiation. The limiter circuit, which contains a monitor receiver realized as a photodiode, limits the current that is flowing through the laser diode by means of a protective circuit that is constructed as an emitter follower and that receives the excess current, which is diverted via a current path that lies parallel to the laser diode. The limiter circuit that is provided independently of the control circuit reaches a considerably shorter response time than the control circuit.

In the specialist journal elektronik industrie, No 05-2004, pages 44 and 45, a circuit arrangement for the switched operation of a laser diode is described, in which mean value control of the radiated optical power is performed by means of a pulse width modulation. This is based on a mean value formation by means of an integrating capacitor, which is discharged during the pulse period and is charged in between the pulse periods. In small duty cycles with correspondingly longer no-pulse periods the voltage at the integrating capacitor can be rise to the point where the laser diode can be exposed to an excess current during the next pulse period. What is suggested to solve this problem is a division of the power source into three separate power sources which can be actuated individually, with their currents overlapping. In the already known circuit arrangement the voltage to be measured obtained from the signal of a monitor photodiode as well as the reference voltage are constantly applied to a comparator. The already known circuit arrangement comprises the special feature that the operation of the laser diode in clocked mode is carried out not through switching of the power source, but through a switching of a separate circuit breaker located in the laser diode circuit.

The invention is based on the objective to indicate a circuit arrangement for operating a laser diode in clocked mode which facilitates a reliable operation of a laser diode in clocked mode by using simple circuitry means.

The objective is reached by the features according to the invention.

DISCLOSURE OF THE INVENTION

The circuit arrangement for operating a laser diode in clocked mode according to the invention is based on the assumption that a monitor photodiode is provided, from the signal of which a measure for the radiation emitted by the laser diode as the voltage to be measured is obtained, and that a comparator is provided that compares the voltage to be measured with a reference voltage and provides it as a difference signal to a controller, wherein the voltage to be measured as well as the reference voltage are constantly applied to the comparator.

The circuit arrangement according to the invention is characterized by the fact that an energy supply of the comparator in clocked mode is provided for performing the operation of the laser diode in clocked mode.

Initially, the circuit arrangement according to the invention shows a very good transient behavior without significant overshoots. The danger of an overload of the laser diode through overshoots is thus clearly reduced. The enhanced transient behavior results from the reduction of down times which can occur through the parasitic capacitance of the monitor photodiode, dynamically acting Miller capacities, as well as saturation effects in the comparator.

The down times no longer have an effect because the two inputs of the comparator are constantly biased with the voltage to be measured that is obtained from the signal of the monitor photodiode or the reference voltage, with the monitor photodiode capacity always staying biased. The voltage to be measured obtained from the signal of the monitor photodiode changes according to the clock pulse of the radiation emitted by the laser diode. But since the comparator is switched off in no-pulse periods, the constant charge reversal of the Miller capacities which come into effect between the respective inputs and outputs of the comparator's transistors are eliminated in the transistor to which the constant reference voltage is supplied, as well as in the transistor to which the voltage to be measured is supplied. The comparator is switched off during the pulse phases and thus cannot transition into a saturated state. The reaction time is additionally shortened due to the fact that the maximally possible control difference at the comparator is kept as small as possible during the no-pulse periods through the increase of the voltage to be measured by a bias voltage.

By switching-off the comparator during the no-pulse periods, any undesired and uncontrolled emission of the laser diode radiation or destruction of the laser diode through overload, which may be caused by the possible occurrence of coupled-in interfering signals at the comparatively high-ohm inputs of the comparator, is avoided. Strong interfering signals cannot be excluded in the use of the circuit arrangement according to the invention, particularly in an environment with a high electromagnetic load, for example in industrial manufacturing.

Advantageous further developments and embodiments of the circuit arrangement according to the invention are discussed below.

An advantageous embodiment provides a realization of the comparator as a symmetrical DC voltage-difference amplifier by using two bipolar transistors, with their emitter connections being connected to each other, and having a common emitter line. Alternatively, the comparator can be realized in the form of a symmetrical DC voltage difference amplifier by using two field effect transistors, with the source connections of the same being connected to each other. Thanks to the emitter activation or source activation, the comparator that is realized as a difference amplifier can be actuated very quickly as the switch-on pulses occur during operation in clocked mode.

Shifting actuation to the emitter actuation or the source activation has the effect that the requirements as to the exactness of the amplitudes of the switch signal for switching the comparator on and off become very small.

Another advantageous embodiment of the circuit arrangement according to the invention provides the realization of the controller as a voltage/current transformer. In this case, the controller can be realized as a comparatively simple voltage-controlled power source with a transistor, wherein the control variable of the controller is the operating current of the laser diode.

In a further development of this embodiment it is provided that a current limitation arrangement is provided in the voltage/current transformer, with this current limitation arrangement being realized in a comparatively simple manner as current negative feedback resistor. Together with the line level of the difference amplifier output, the current feedback resistor can be regarded as a first protective measure that limits the pulsed operating current of the laser diode to a maximal value.

Alternatively or additionally, a protective resistor can be provided, which is connected in series with the laser diode, which limits the operating current during the pulse periods of the laser diode to a maximal value.

Alternatively or additionally, a protective resistor can be provided, that is switched in parallel with the laser diode and that limits the operating current during the pulse periods of the laser diode to a maximal value.

Alternatively or additionally, the laser diode can be protected by a current limitation arrangement provided in the laser diode energy supply.

According to a further advantageous embodiment, the laser diode is protected against a possible overtemperature by the overtemperature protective circuit, which disrupts the operating current of the laser diode as a temperature threshold value is being exceeded.

Other advantageous further developments and embodiments of the circuit arrangement according to the invention follow from the following description. Exemplary embodiments of the invention are shown in the drawing and explained in more detail in the following description.

SHORT DESCRIPTION OF THE DRAWINGS

Figure 2:
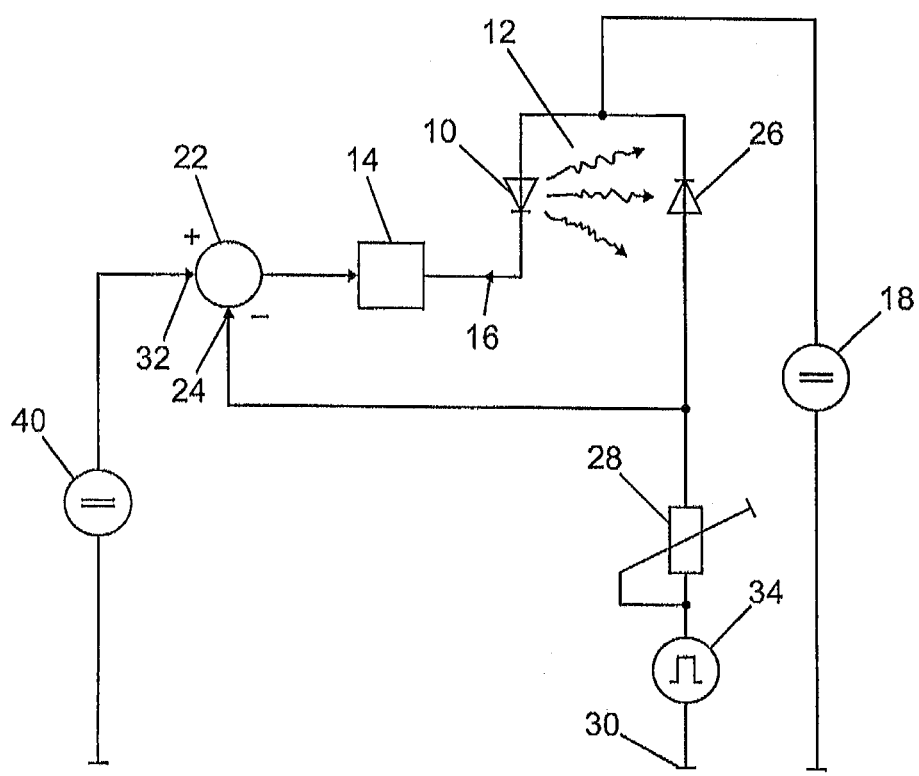
Figure 3:
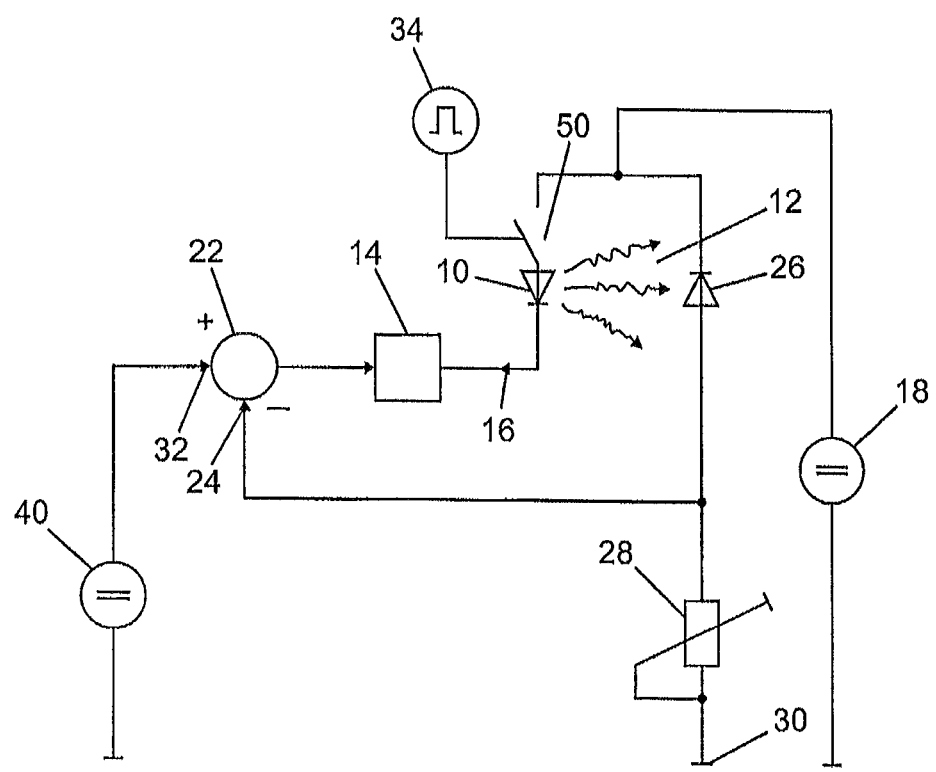
Figure 4:
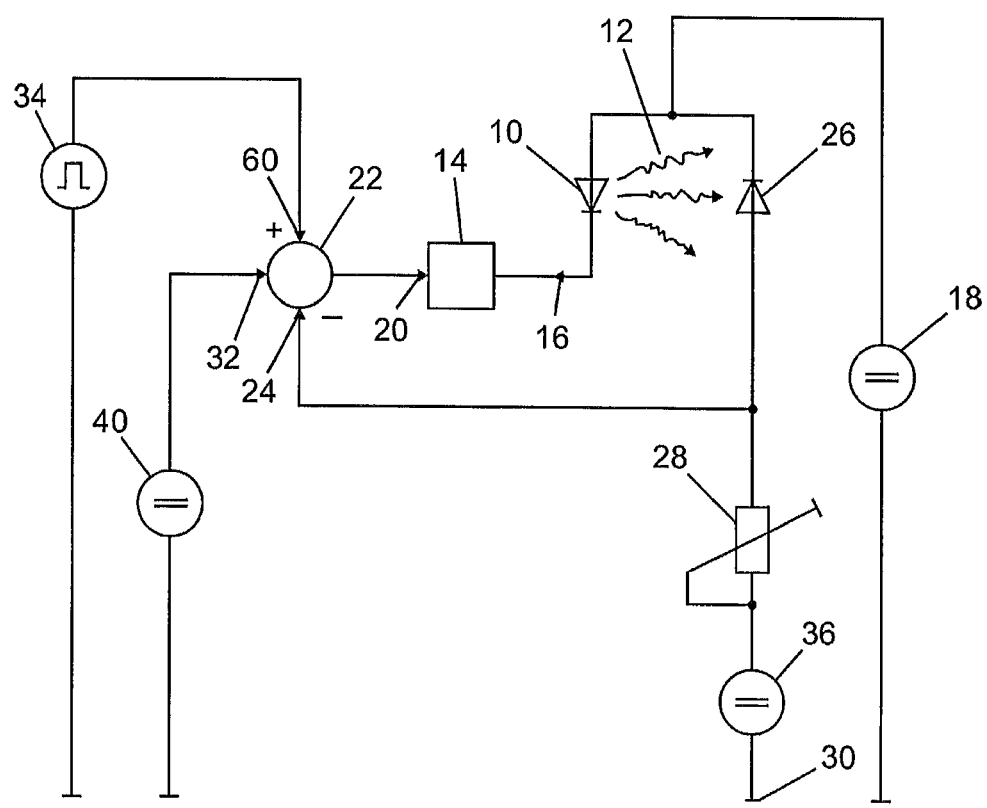
Figure 5:
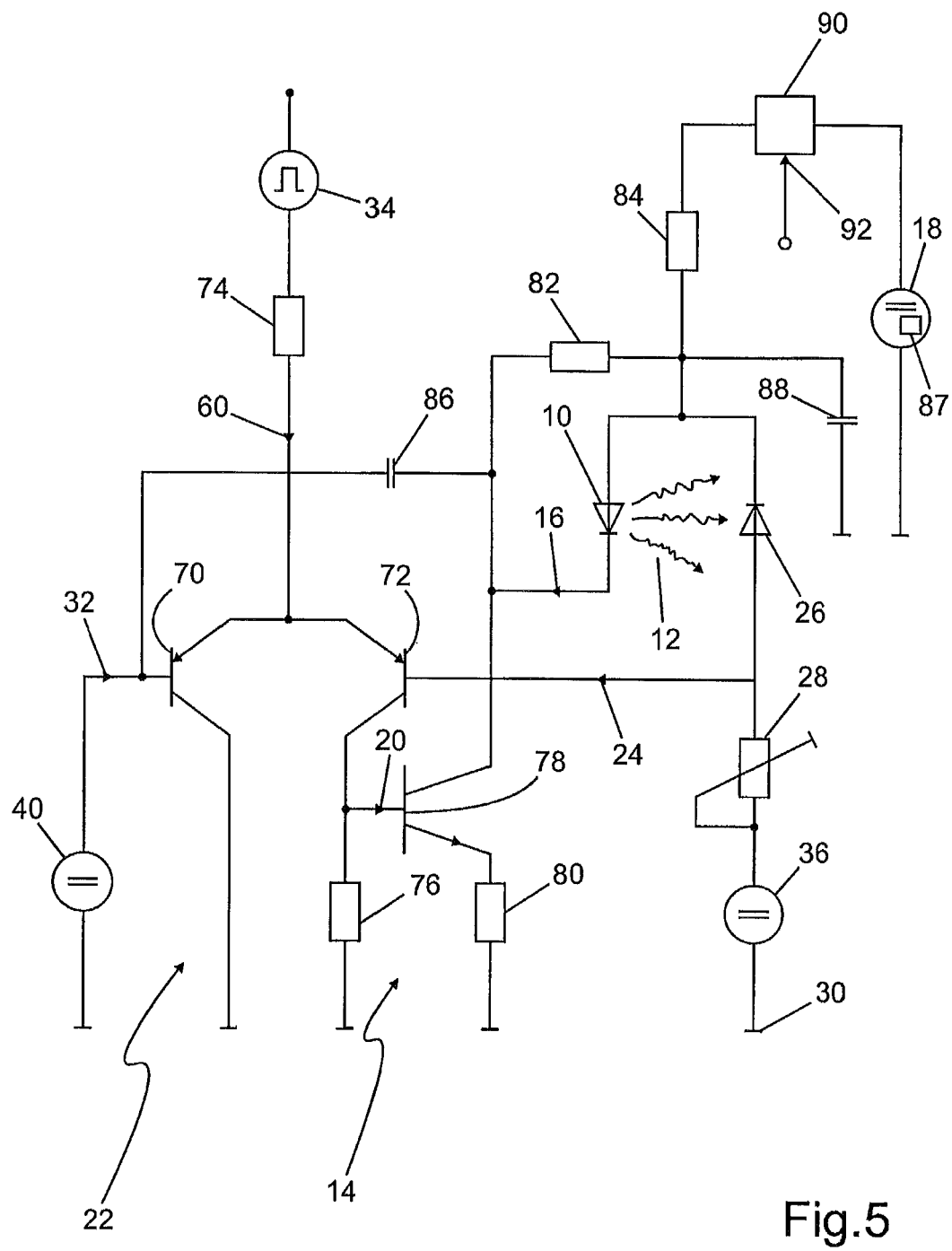
Figure 6:
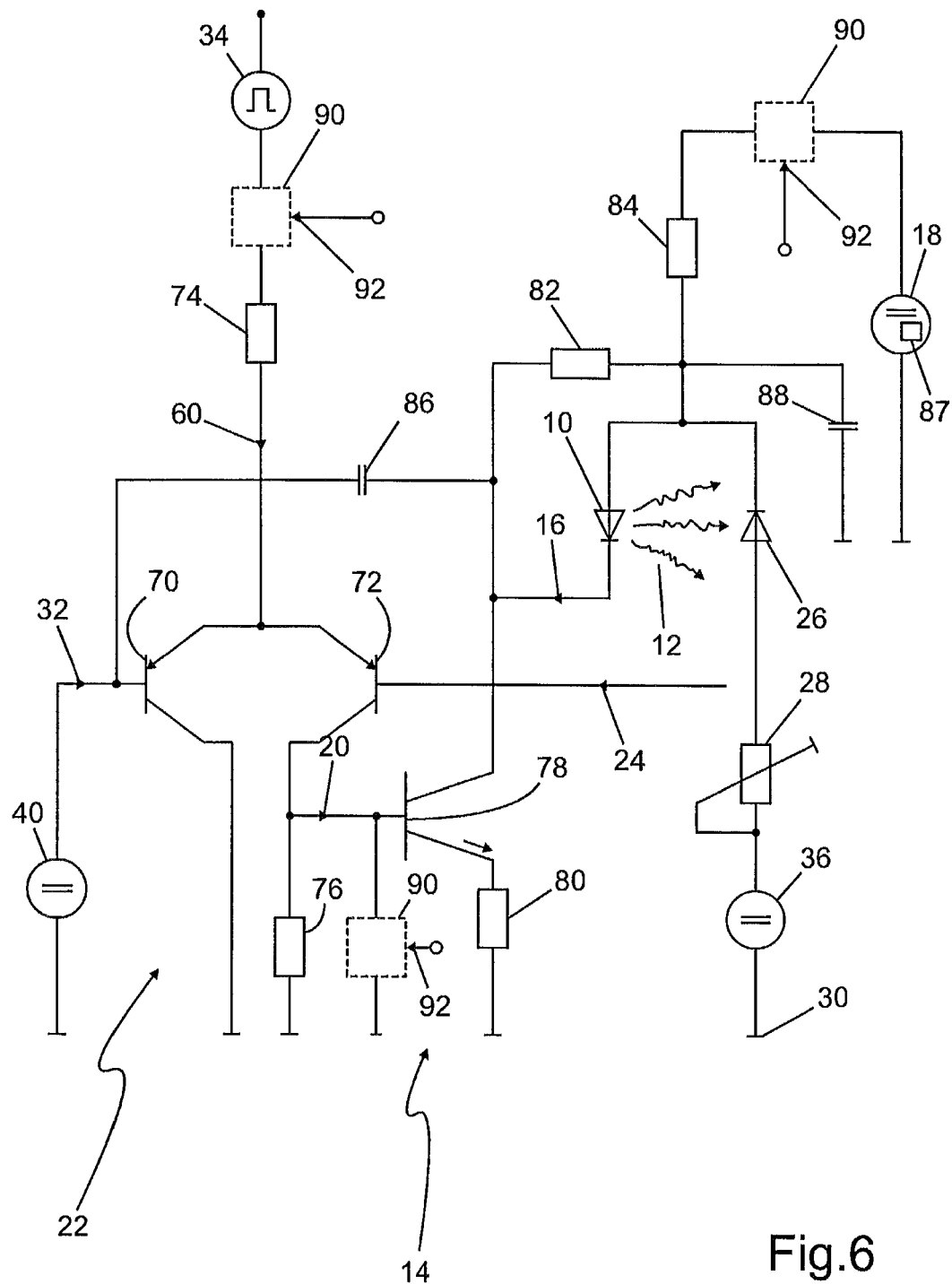

In the drawings:

FIG. 1 shows a circuit arrangement for operating a laser diode in clocked mode according to the state of the art, in which a reference voltage applied to a comparator is preset in a clocked manner, FIG. 2 shows a circuit arrangement for operating a laser diode in clocked mode according to the state of the art, in which a voltage to be measured that is applied to a comparator is preset in a clocked manner, FIG. 3 shows a circuit arrangement for operating a laser diode in clocked mode according to the state of the art, in which a switch that is actuated in a clocked manner is provided in the circuit of a laser diode, FIG. 4 is a functional circuit diagram of a circuit arrangement for operating a laser diode in clocked mode according to the invention, FIG. 5 is a detailed circuit diagram of a circuit arrangement for operating a laser diode in clocked mode according to the invention, and FIG. 6 is a detailed circuit diagram of a circuit arrangement for operating a laser diode in clocked mode according to the invention with alternative embodiments.

EMBODIMENTS

FIG. 1 shows a circuit arrangement for operating a laser diode in clocked mode according to the state of the art. A laser diode 10, which emits a radiation 12 during operation, is operated by means of a controller 14 at an operating current 16, which is provided by the laser diode energy source 18. The operating current 16 is the control variable of the controller 14, which is adjusted depending on an output voltage 20 of a comparator 22.

The comparator 22 is supplied with a voltage to be measured 24 as an actual value, which is obtained from the signal of a monitor photodiode 26 onto which the radiation 12 of the laser diode 10 impinges. The laser diode 10 and the monitor photodiode 26 are preferably contained in a laser diode module. In the shown exemplary embodiment, a trimm resistor 28 is provided for setting the working time of the monitor photodiode 26, with the trimm resistor 28 being connected between the monitor photodiode 26 and a circuit ground 30. The bias voltage of the monitor photodiode 26 is set by means of the trimm resistor 28.

Further, the comparator 22 is provided with a reference voltage 32 as a set point, which is supplied by a clock generator 34.

The laser diode 10 may for example be installed inside an optoelectronic sensor for providing the transmission radiation. The laser diode 10 provides a monochromatic and coherent radiation, which can easily be focused or collimated by means of a simple optics appliance. The advantages of the laser diode 10 being installed in an optoelectronic sensor are, for example, a comparatively small radiation profile, which facilitates a detection of small parts, for example, or a higher energy density, which makes a higher operating range of the optoelectronic sensor possible.

As has already been mentioned in the beginning, the limit values that are preset by the manufacturer of the laser diode 10 may not be exceeded with regard to the radiated power, the operating voltage and the operating current 16. In particular, the observance of the operating current 16 is to be ensured by means of the controller 1, which adjusts the operating current 16 as a control variable of the controller depending on the voltage to be measured 24 that is obtained from the signal of the monitor photodiode 26 as the actual value, and depending on the reference voltage 32 that is provided by the clock generator 34 as a set point.

The circuit arrangement according to the state of the art shown in FIG. 1 is based on the assumption that the operation of the laser diode 10 in clocked mode, for example an operation with a pulse width modulation, is preset by the clock generator 34, which provides the reference voltage 32 as a set point to the comparator 22. The comparator 22, which is realized in the form of a difference amplifier, is constantly ready to operate during the operation phase of the laser diode 10 as well as during the operating pauses of the laser diode 10. Due to the clocked reference voltage 32, the comparator is switched between two extreme values, which result in a correspondingly switched output voltage 20 of the comparator 22. The parasitic capacitances that are inevitable because of the circuitry-wise realization of the comparator 22 influence the switching procedures, wherein the oscillation processes during the transition between an operating phase or pulse period and an operating pause or no-pulse period of the laser diode 10 cannot be completely avoided, which may pose a potential danger to the laser diode 10. Accordingly, such effects have to be considered in the dimensioning of the comparator 22.

The circuit arrangement for operating the laser diode 10 in clocked mode that is shown in FIG. 2 shows an alternative embodiment according to the state of the art.

Those components shown in FIG. 2 that correspond to the components shown in FIG. 1 have the same reference signs, respectively. This understanding analogously applies to the following figures, as well.

In this circuit arrangement, the reference voltage 32 of the comparator 22 is maintained at a constant set point by means of a reference voltage generator 40. In this circuit arrangement, the default of the operation in clocked mode of the laser diode 10 is again preset by the clock generator 34, which, however, instead of providing the reference voltage 32, provides the voltage to be measured 24 obtained from the signal of the monitor photodiode 26 to the comparator 22 in a clocked manner as the actual value. In this circuit arrangement, too, the comparator 22 is constantly ready to operate during the pulse period as well as during the no-pulse period of the clock generator 34. The problem of overshoots during the transitions between pulse periods and no-pulse periods occurs in the same manner as in the circuit arrangement shown in FIG. 1. In addition, the dynamic properties of the circuit arrangement are adversely influenced by the operation of the monitor photodiode 26 in clocked mode, particularly by its parasitic capacitance.

In the circuit arrangement for operating the laser diode 10 in clocked mode according to the state of the art that is shown in FIG. 3, the reference voltage 32 as well as the voltage to be measured 24 obtained from the signal of the monitor photodiode 26 are constantly applied to the comparator 22, so that switching procedures in the comparator 22, at least at that input at which the reference voltage 32 is present, are avoided. In this circuit arrangement, the operation in clocked mode of the laser diode 10 is realized by means of an additional electronic switch 50, which is connected in series with the laser diode 10. The switch 50 is opened or closed by the clock generator 34 with the preset clock pulse.

Also in the circuit arrangement shown in FIG. 3, the comparator 22 is constantly in operation during the pulse periods as well as during the no-pulse periods of the signal provided by the clock generator 34. In the circuit arrangement shown in FIG. 3 as well as in the circuit arrangements shown in FIGS. 1 and 2, interfering signals can be coupled-in in the circuit arrangement during the no-pulse period, which may particularly act on the comparator 22 that is realized as a difference amplifier due to its voltage-amplifying function. An undesired emission of radiation 12 by the laser diode 10 during the no-pulse periods cannot be completely excluded. Also, comparatively strong interfering signals, particularly during the no-pulse periods determined by the clock generator 34, may lead to a short and therefore harmful overload of the laser diode 10.

The circuit arrangements shown in FIGS. 1 to 3 have in common that the comparator 22 remains permanently active and thus collapses into a saturated state during the no-pulse periods, which has a negative effect on the response speed.

Thus, it is provided according to the invention that for carrying out the operation of the laser diode 10 in clocked mode, the energy supply of the comparator 22 is clocked. The operating voltage or the operating current of the comparator 22 is completely switched on or switched off. In the circuit arrangement according to the invention shown in FIG. 4, the operating voltage 60 of the comparator 22 is preset in a clocked manner by the clock generator 34, so that the comparator 22 is only in operation during the pulse periods while being switched off during the no-pulse periods.

Interfering signals that may particularly have a negative effect on the comparator 22 during the no-pulse periods remain without effect and do not influence the output voltage 20 of the comparator 22.

The voltage to be measured 24 diverted from the monitor photodiode 26 is raised to a level that is at least similar to the voltage of the reference voltage generator 40 by means of a bias voltage source 36.

Due to the switched operating voltage 60 of the comparator 22, the reference voltage 32 as well as the voltage to be measured 24 can constantly be made available to the comparator 22, so that re-storage procedures of parasitic capacitance of the comparator 22 that is realized as a difference amplifier are no longer necessary.

FIG. 5 shows a detailed circuit diagram as an exemplary embodiment of the circuit arrangement according to the invention according to FIG. 4. The comparator 22 is realized with the two transistors 70, 72, wherein in the shown exemplary embodiment bipolar transistors are assumed. The two transistors 70, 72 form a symmetrical difference amplifier, in which the emitter connections of the two transistors 70, 72 are connected to each other and are connected via a resistor 74 to the clock generator 34, which provides the operating voltage or the operating current 60 of the comparator 22 in a clocked manner.

While the collector connection of the first transistor 70 is connected directly to the circuit ground 30, the collector connection of the second transistor 72 is connected to the circuit ground 30 via a load resistor 76, to which the amplified differential voltage 20 is applied as output voltage. At the base connection of the first transistor 70 the reference voltage 32 is applied as the set point, which the reference voltage source 40 supplies. The voltage to be measured 24 that is obtained from the signal of the monitor photodiode 26 is applied as the actual value to the base connection of the second transistor 72.

The reference voltage 32 is continuously applied. Likewise, the voltage to be measured 24 that is amplified by the bias voltage source 36 is not switched off during the no-pulse period of the operation in clocked mode, so that the capacity of the monitor photodiode 26 always remains biased. However, the voltage to be measured 24 changes as there is no radiation 12 emitted by the laser diode 10 during the no-pulse periods.

In addition, the reaction time is decreased by the fact that the maximally possible control difference at the comparator 22 is kept as small as possible during the no-pulse periods by means of increasing the voltage to be measured 24 by the voltage of the bias voltage source 36.

The parasitic capacitance that is present respectively between the collector connection and the base connection of the transistors 70, 72 and that become amplified in their effect as they are multiplied by the current amplification factor of the transistors 70, 72 at the base connections (Miller capacity), does not have to be charge-reversed due to the permanently applied voltages at the base connection of the respective transistors 70, 72. While the reference voltage 32 is constant, the voltage to be measured 24 is clocked according to the clock pulse of the clock generator 34. Since the comparator 22 is completely switched off during the no-pulse periods, the charge reversal of the parasitic capacitance between the base connection and the collector connection of the second transistor 72 does not have any effect on the switch-off time. Additionally, through switching-off of the comparator 22 during the no-pulse periods, a saturated state of the transistor 72 or 70 is prevented in the difference amplifier.

By switching-off of the comparator 22 during the no-pulse periods, undesired and uncontrolled emission of radiation 12 emitted by the laser diode 10 or a destruction of the laser diode 10 through overload, which may be caused by possibly occurring interfering signal couplings at the comparatively high-ohm base connections of the transistors 70, 72 of the comparator 22, are avoided.

Particularly advantageous is the activation of the comparator 22 via the common emitter connections of the two transistors 70, 72. Through the emitter activation the symmetrical difference amplifier can be actuated quickly, whereby the danger of signal overshooting is further reduced.

The emitter actuation of the symmetrical difference amplifier of the comparator 22 also entails the advantage that the requirements with regard to the amplitude accuracy of the pulse signal that is supplied by the clock generator 34 only play a minor role.

In the shown exemplary embodiment it is assumed that the difference amplifier of the comparator 22 is realized with bipolar transistors. Alternatively, the two transistors 70, 72 can be realized as field effect transistors, wherein in that case the two source connections of the field effect transistors are connected to each other and are supplied with energy via the resistor 74 by means of the clock generator 34.

The controller 14, which is preferably realized as a voltage/current transformer, is realized according to a particularly simple embodiment as a voltage-controlled power source.

The differential voltage that is increased by the difference amplifier is present as an output voltage 20 at the load resistor 76. The output voltage 20 is supplied to a base connection of a third transistor 78. The emitter connection of the third transistor 78 is connected to the circuit ground 30 via a current negative feedback resistor 80. The operating current 16 of the laser diode 10 during the pulse periods is determined substantially by the resistance value of the current negative feedback resistor 80 and the voltage applied to the current negative feedback resistor 80. The voltage corresponds to the output voltage 20 of the comparator 22, from which the basis emitter voltage of the third transistor 78 is subtracted. Here, the maximal output voltage 20 of the comparator 22 is limited in a defined manner through the common emitter current or source current of the difference amplifier 22 and the resistor 76.

The collector connection of the third transistor 78 is connected to the laser diode energy supply 18 via another load resistor 82 and via a protective resistor 84. While the resistance value of the protective resistor 84 lies in the range of 1-50 Ohm, for example, the resistance value of the other load resistor is 10 kOhm, for example.

Preferably, a negative feedback capacitor 86 is provided, which leads from the output of the controller 14 to an input of the comparator 22, in the shown exemplary embodiment to the base connection of the first transistor 70. The negative feedback capacitor 86, that has a capacity that lies in the range of 10-100 pF, for example, suppresses a tendency to oscillation at higher frequencies.

Initially, the current negative feedback resistor 80 present in the voltage/current transformer limits the operating current 16 flowing through the laser diode 10 during the pulse periods to a maximum value.

Further, in the case of an error, the protective resistor 84 alternatively or additionally limits the operating current 16 flowing through the laser diode 10 during the pulse periods to a maximal value.

In addition to that, a current limitation arrangement 87 may be provided in the laser diode energy supply 18, also additionally or alternatively limiting the operating current 16 running through the laser diode 10 during the pulse periods.

Preferably, a buffering capacitor 88 is provided, having a capacity that lies in the range of 1-10 pF, for example. In a low-inductance embodiment of the buffering capacitor 88, the (impulse) operating current 16 of the laser diode 10 is substantially supplied by the buffering capacitor 88 during the pulse period. The laser diode energy supply 18 only has to be capable to subsequently supply the medium operating current 16 via the protective resistor 84.

In addition, interference peaks on the laser diode energy supply 18 are filtered and the pulse current load is decoupled with regard to the reference voltage source 40 and the bias voltage source 36.

According to an advantageous embodiment of the circuit arrangement according to the invention, an overtemperature protective circuit 90 is provided, which is supplied with a temperature signal 92. The temperature signal 92 may for example be provided by a temperature sensor that is not shown in more detail and that is preferably thermally coupled to the laser diode 10. When the laser diode 10 is heated up to inadmissible values, the temperature signal 92 ensures a response of the overtemperature protective circuit 90, which may for example be realized as a switch that is opened in the event of an overtemperature.

FIG. 6 shows an embodiment of the circuit arrangement for operating the laser diode 10 in clocked mode according to the invention, in which alternative positions of the overtemperature protective circuit 90 are provided. Apart from the position of the overtemperature protective circuit 90 in the circuit of the laser diode 10 as it is shown in FIG. 5, the overtemperature protective circuit 90 can be connected in series with resistor 74 that is located in the power supply circuit of the comparator 22. When an overtemperature has occurred, the overtemperature protective circuit 90 makes sure that the comparator 22 remains switched off independently of the default provided by the clock generator 34, and thus cannot any longer actuate the laser diode 10.

An additional alternative position of the overtemperature protective circuit 90 is provided in the arrangement of the overtemperature protective circuit 90 in the controller 14. In the shown exemplary embodiment, the overtemperature protective circuit 90 short-circuits the base connection of the transistor 78 against the circuit ground 30 when an overtemperature has occurred, so that the transistor 78 can no longer put the laser diode 10 into operation. Because multiple alternative positions of the overtemperature protective circuit 90 are rendered, the overtemperature protective circuit 90 is respectively shown in the form of a broken line in FIG. 6.

The invention claimed is:

1. Circuit arrangement for operating a pulsed laser diode in clocked mode, comprising a monitor photodiode, from the signal of which a measure of the radiation emitted by the laser diode is obtained as voltage to be measured, and comprising a comparator which compares the voltage to be measured with a reference voltage so that a difference signal is formed and provides the difference signal to a controller, and comprising an operating voltage supply device comprising a clock generator and providing an energy supply to operate the comparator in a clocked manner such that the comparator switches between a switched-on state and a switched-off state, wherein the operating voltage supply device completely switches on the comparator in the switched-on state, wherein the operating voltage supply device completely switches off the comparator in the switched-off state, wherein both the voltage to be measured and the reference voltage are applied continuously to the comparator, wherein the energy supply from the operating voltage supply device to the comparator is preset in the clocked manner by the clock generator so that the laser diode is switched on during the switched-on state and the switched-on state of the comparator only occurs during each pulse of the laser diode and so that the laser diode is switched off during the switched-off state and the switched-off state of the comparator only occurs during each non-pulse of the laser diode, wherein a voltage/current converter is provided as controller, wherein the voltage/current converter has a current source and the current source comprises a transistor and a current negative feedback resistor, and wherein the current negative feedback resistor limits the operating current of the laser diode to a maximal value.

2. Circuit arrangement according to claim 1, wherein the comparator contains a symmetrical DC voltage-difference amplifier comprising two bipolar transistors, with their emitter connections being connected to each other.

3. Circuit arrangement according to claim 2, wherein an emitter actuation of the two bipolar transistors is provided for the clocked-mode energy supply of the comparator.

4. Circuit arrangement according to claim 1, wherein the comparator contains a symmetrical DC voltage-difference amplifier comprising two field effect transistors, with their source connections being connected to each other.

5. Circuit arrangement according to claim 4, wherein a source actuation of the two field effect transistors is provided for the clocked-mode energy supply of the comparator.

6. Circuit arrangement according to claim 1, wherein a current limitation arrangement is provided in a laser diode energy supply.

7. Circuit arrangement for operating a pulsed laser diode in clocked mode, comprising a monitor photodiode, from the signal of which a measure of the radiation emitted by the laser diode is obtained as voltage to be measured, and comprising a comparator which compares the voltage to be measured with a reference voltage so that a difference signal is formed and provides the difference signal to a controller, and comprising an operating voltage supply device comprising a clock generator and providing an energy supply to operate the comparator in a clocked manner such that the comparator switches between a switched-on state and a switched-off state, wherein the operating voltage supply device completely switches on the comparator in the switched-on state, wherein the operating voltage supply device completely switches off the comparator in the switched-off state, wherein both the voltage to be measured and the reference voltage are applied continuously to the comparator, wherein the energy supply from the operating voltage supply device to the comparator is preset in the clocked manner by the clock generator so that the laser diode is switched on during the switched-on state and the switched-on state of the comparator only occurs during each pulse of the laser diode and so that the laser diode is switched off during the switched-off state and the switched-off state of the comparator only occurs during each non-pulse of the laser diode, and wherein a bias voltage source is provided, the bias voltage source increasing the voltage to be measured by a preset voltage.

8. Circuit arrangement for operating a pulsed laser diode in clocked mode, comprising a monitor photodiode, from the signal of which a measure of the radiation emitted by the laser diode is obtained as voltage to be measured, and comprising a comparator which compares the voltage to be measured with a reference voltage so that a difference signal is formed and provides the difference signal to a controller, and comprising an operating voltage supply device comprising a clock generator and providing an energy supply to operate the comparator in a clocked manner such that the comparator switches between a switched-on state and a switched-off state, wherein the operating voltage supply device completely switches on the comparator in the switched-on state, wherein the operating voltage supply device completely switches off the comparator in the switched-off state, wherein both the voltage to be measured and the reference voltage are applied continuously to the comparator, wherein the energy supply from the operating voltage supply device to the comparator is preset in the clocked manner by the clock generator so that the laser diode is switched on during the switched-on state and the switched-on state of the comparator only occurs during each pulse of the laser diode and so that the laser diode is switched off during the switched-off state and the switched-off state of the comparator only occurs during each non-pulse of the laser diode, wherein a protective resistor is provided for limiting the operating current of the laser diode that is flowing during pulse periods, and wherein the protective resistor is connected in series with the laser diode.

9. Circuit arrangement for operating a pulsed laser diode in clocked mode, comprising a monitor photodiode, from the signal of which a measure of the radiation emitted by the laser diode is obtained as voltage to be measured, and comprising a comparator which compares the voltage to be measured with a reference voltage so that a difference signal is formed and provides the difference signal to a controller, and comprising an operating voltage supply device comprising a clock generator and providing an energy supply to operate the comparator in a clocked manner such that the comparator switches between a switched-on state and a switched-off state, wherein the operating voltage supply device completely switches on the comparator in the switched-on state, wherein the operating voltage supply device completely switches off the comparator in the switched-off state, wherein both the voltage to be measured and the reference voltage are applied continuously to the comparator, wherein the energy supply from the operating voltage supply device to the comparator is preset in the clocked manner by the clock generator so that the laser diode is switched on during the switched-on state and the switched-on state of the comparator only occurs during each pulse of the laser diode and so that the laser diode is switched off during the switched-off state and the switched-off state of the comparator only occurs during each non-pulse of the laser diode, wherein a overtemperature protective circuit is provided, and wherein the overtemperature protective circuit switches off the operation of the laser diode via a temperature signal if an overtemperature of the laser diode is present.

10. Circuit arrangement according to claim 9, wherein the overtemperature protective circuit inhibits the operating current of the laser diode if an overtemperature occurs.

11. Circuit arrangement according to claim 9, wherein the overtemperature protective circuit terminates the operation of the controller if an overtemperature occurs.

12. Circuit arrangement according to claim 9, wherein the overtemperature protective circuit terminates the operation of the comparator if an overtemperature occurs.

* * * * *